US011270514B2

(12) United States Patent
Loberg et al.

(10) Patent No.: US 11,270,514 B2
(45) Date of Patent: *Mar. 8, 2022

(54) MIXED-REALITY AND CAD ARCHITECTURAL DESIGN ENVIRONMENT

(71) Applicant: DIRTT ENVIRONMENTAL SOLUTIONS LTD., Calgary (CA)

(72) Inventors: Barrie A. Loberg, Millarville (CA); Joseph Howell, Uintah, UT (US); Robert Blodgett, Salt Lake City, UT (US); Simon Francis Stannus, Millcreek, UT (US); Matthew Hibberd, Sheffield (GB); Tyler West, Calgary (CA)

(73) Assignee: DIRTT ENVIRONMENTAL SOLUTIONS LTD., Calgary (CA)

( * ) Notice: Subject to any disclaimer, the term of this patent is extended or adjusted under 35 U.S.C. 154(b) by 3 days.

This patent is subject to a terminal disclaimer.

(21) Appl. No.: 16/903,212

(22) Filed: Jun. 16, 2020

(65) Prior Publication Data
US 2020/0312039 A1    Oct. 1, 2020

Related U.S. Application Data

(63) Continuation of application No. 15/741,487, filed as application No. PCT/US2017/036871 on Jun. 9, 2017, now Pat. No. 10,699,484.
(Continued)

(51) Int. Cl.
*G06T 19/00* (2011.01)
*G06F 3/0484* (2013.01)
(Continued)

(52) U.S. Cl.
CPC ........ *G06T 19/006* (2013.01); *G06F 3/04815* (2013.01); *G06F 3/04845* (2013.01);
(Continued)

(58) Field of Classification Search
CPC ......... G06T 19/006; G06T 2207/10028; G06T 2207/20076; G06T 19/003; G06T 19/00;
(Continued)

(56) References Cited

U.S. PATENT DOCUMENTS 8,745,494 B2    6/2014  Spivack
2002/0033845 A1  3/2002  Elber et al.
(Continued)

FOREIGN PATENT DOCUMENTS

CN    102495959 A    6/2012
EP    2662839 A1    11/2013
(Continued)

OTHER PUBLICATIONS

Elvins "Wordlets—3D Thumbnails for Wayfinding in Virtual Environments," UIST '97. 10th Annual Symp. on User Interface Software and Technology. Alberta, Canada, pp. 21-30, XP001150324 ISBN: 978-0-89791-881-7 (Oct. 14, 1997).
(Continued)

*Primary Examiner* — Xiao M Wu
*Assistant Examiner* — Scott E Sonners
(74) *Attorney, Agent, or Firm* — Workman Nydegger (57) ABSTRACT

A computer system for creating architectural schematics within a mixed-reality environment generates, within an architectural design application, mixed-reality rendering data that visually describes one or more virtual architectural elements in relation to a real-world environment. The computer system transmits, to a mixed-reality device, the mixed-reality rendering data, wherein the mixed-reality device renders the mixed-reality rendering data within the real-world environment. The computer system also receives a command from a user directed towards a particular virtual architectural element. Additionally, the computer system constrains a scope of the command based upon an interac-
(Continued)

tion between the virtual architectural element and the real-world environment.

19 Claims, 7 Drawing Sheets

Related U.S. Application Data (60) Provisional application No. 62/378,592, filed on Aug. 23, 2016, provisional application No. 62/348,721, filed on Jun. 10, 2016.

(51) Int. Cl.

| | | |
|---|---|---|
| *G06F 3/0481* | (2013.01) | |
| *G06F 30/00* | (2020.01) | |
| *G06F 30/13* | (2020.01) | |
| *G06T 7/60* | (2017.01) | |
| *G06T 19/20* | (2011.01) | |
| *G06F 3/04845* | (2022.01) | |
| *G06F 3/04815* | (2022.01) | |

(52) U.S. Cl.
CPC .............. *G06F 30/00* (2020.01); *G06F 30/13* (2020.01); *G06T 7/60* (2013.01); *G06T 19/00* (2013.01); *G06T 19/20* (2013.01); *G06T 2219/2016* (2013.01)

(58) Field of Classification Search
CPC . G06T 19/20; G06T 2219/2016; G06T 7/001; G06T 7/60; G06T 7/62; G02B 27/01; G02B 27/017; G06K 9/00671; G06F 17/50; G06F 17/5004; G06F 3/04815; G06F 3/04845; G06F 3/011
See application file for complete search history.

(56) References Cited

U.S. PATENT DOCUMENTS

| | | |
|---|---|---|
| 2005/0276444 A1 | 12/2005 | Zhou et al. |
| 2009/0046140 A1 | 2/2009 | Lashmet et al. |
| 2010/0125799 A1 | 5/2010 | Roberts et al. |
| 2010/0253679 A1 | 10/2010 | Vyakhirev |
| 2010/0289817 A1 | 11/2010 | Meier et al. |
| 2012/0212400 A1 | 8/2012 | Border et al. |
| 2012/0268463 A1 | 10/2012 | Loberg |
| 2012/0310602 A1 | 12/2012 | Jacobi et al. |
| 2013/0141421 A1 | 6/2013 | Mount et al. |
| 2013/0176302 A1 | 7/2013 | Jeong et al. |
| 2013/0179841 A1 | 7/2013 | Mutton et al. |
| 2013/0278631 A1 | 10/2013 | Border et al. |
| 2013/0286004 A1 | 10/2013 | Mcculloch et al. |
| 2013/0300637 A1 | 11/2013 | Smits et al. |
| 2013/0342564 A1 | 12/2013 | Kinnebrew et al. |
| 2014/0114845 A1 | 4/2014 | Rogers et al. |
| 2014/0132595 A1 | 5/2014 | Boulanger et al. |
| 2014/0168261 A1 | 6/2014 | Margolis et al. |
| 2014/0204117 A1 | 7/2014 | Kinnebrew et al. |
| 2014/0204177 A1 | 7/2014 | Hattori |
| 2014/0221090 A1 | 8/2014 | Mutschler et al. |
| 2014/0237366 A1 | 8/2014 | Poulos et al. |
| 2014/0368532 A1 | 12/2014 | Keane et al. |
| 2015/0097719 A1 | 4/2015 | Balachandreswaran et al. |
| 2015/0116316 A1 | 4/2015 | Fitzgerald et al. |
| 2015/0235474 A1 | 8/2015 | Mullins |
| 2015/0316985 A1 | 11/2015 | Levesque et al. |
| 2016/0026253 A1 | 1/2016 | Bradski et al. |
| 2016/0077798 A1 | 3/2016 | Pradeep et al. |
| 2016/0148433 A1* | 5/2016 | Petrovskaya .......... G02B 27/01 345/633 |
| 2016/0257000 A1 | 9/2016 | Guerin et al. |
| 2016/0300392 A1 | 10/2016 | Jonczyk et al. |
| 2016/0317866 A1 | 11/2016 | Fung |
| 2016/0379418 A1 | 12/2016 | Osborn et al. |
| 2017/0076500 A1* | 3/2017 | Maggiore ............ G06T 19/006 |
| 2017/0132841 A1 | 5/2017 | Morrison |
| 2017/0268871 A1 | 9/2017 | Tenma et al. |
| 2017/0308626 A1 | 10/2017 | Loberg et al. |
| 2020/0312039 A1 | 10/2020 | Loberg et al. |

FOREIGN PATENT DOCUMENTS

| | | | |
|---|---|---|---|
| JP | 2011007607 A | * | 10/2011 |
| WO | 2014/116231 A1 | | 7/2014 |
| WO | 2016/0///98 A1 | | 5/2016 |
| WO | 2017/214576 A1 | | 12/2017 |

OTHER PUBLICATIONS

EPO Office Action, U.S. Appl. No. 17/811,115, dated Jan. 7, 2020.
Final Office Action for U.S. Appl. No. 15/518,378 dated Feb. 7, 2019.
Insko "Passive haptics significantly enhances virtual environments," XP055662450, ISBN: 978-0-493-17286-6, Dec. 31, 2001.
International Search Report and Written Opinion dated Sep. 11, 2017 from International Patent Application No. PCT/US2017/036838 filed Jun. 9, 2017.
International Search Report and Written Opinion for PCT/US2017/036871 dated Sep. 14, 2017.
Johansson "BIM to VR—Integrating immersive . . . ", FUSION—Proc. of the 32ND ECAADE Conf., vol. 2, EXAADE 2014, p. 261, XP055473701, ISBN: 978-94-912-0706-8, Sep. 12, 2014.
MacKinlay "Rapid Controlled Movement . . . ", Computer Hraphics, ACM, US. vol. 24-4, p. 171-176, XP000603087, ISSN: 0097-8930, Aug. 6, 1990.
Non-Final Office Action for U.S. Appl. No. 15/518,378 dated Jun. 10, 2019.
Notice of Allowance dated Aug. 1, 2019 from U.S. Appl. No. 15/741,488, filed Jan. 2, 2018.
Notice of Allowance received for U.S. Appl. No. 15/741,487, dated Jun. 4, 2020, 3 pages.
Office Action dated Apr. 12, 2019 from U.S. Appl. No. 15/741,488, filed Jan. 2, 2018.
Office Action dated Nov. 27, 2019 from U.S. Appl. No. 15/518,378, filed Apr. 11, 2017.
Office Action for U.S. Appl. No. 15/518,378 dated Aug. 27, 2018.
Singapore Search Report for Application No. 11201703011V dated Nov. 13, 2017.
Steinicke "Human Walking in Virtual Environments", New York, XP055445675, ISBN: 978-1-4939-0011-4, pp. 221-262, Sec. 10.3.1, May 27, 2014.
Summons to Attend Oral Proceedings for European Application No. 15850198, dated Feb. 5, 2020.
Supplementary Search Report for application No. EP15850198.1 dated May 22, 2018.
Written Opinion for application No. 11201703011V dated Jun. 26, 2018.

\* cited by examiner

MIXED-REALITY AND CAD ARCHITECTURAL DESIGN ENVIRONMENT

CROSS-REFERENCE TO RELATED APPLICATIONS

The present application is a continuation of U.S. patent application Ser. No. 15/741,487, filed on Jan. 2, 2018 entitled "Mixed-Reality and CAD Architectural Design Environment," which application is a 35 U.S.C. § 371 U.S. National Stage of PCT Application No. PCT/US2017/036871, filed Jun. 9, 2017, which claims the benefit of U.S. Patent Application No. 62/378,592, filed on Aug. 23, 2016 and the benefit of U.S. Patent Application No. 62/348,721, filed on Jun. 10, 2016. The entire content of each of the foregoing patent applications is incorporated herein by reference.

BACKGROUND

As computerized systems have increased in popularity, so have the range of applications that incorporate computational technology. Computational technology now extends across a broad range of applications, including a wide range of productivity and entertainment software. Indeed, computational technology and related software can now be found in a wide range of generic applications that are suited for many environments, as well as fairly industry-specific software.

One such industry that has employed specific types of software and other computational technology increasingly over the past few years is that related to building and/or architectural design. In particular, architects and interior designers ("or designers") use a wide range of computer-aided design (CAD) software or building information (BIM) software (i.e., "architectural design software applications") for designing the aesthetic as well as functional aspects of a given residential or commercial space. For example, a designer might use a CAD or BIM program to design a building or part of a building, and then utilize drawings or other information from that program to order or manufacture building components.

One particular benefit that is offered by modern CAD and BIM software is the ability to see a three-dimensional rendering of an architectural design. This can provide tremendous value to designers and/or clients who wish to visualize a design before starting the actual building process. For example, in at least one conventional system, a user may be able to view on a computer screen a completely rendered office building. The user may be able to navigate within the three-dimensional renderings such that the user can view different perspectives and locations throughout the design.

While three-dimensional renderings can provide a user with a general idea regarding a final product, conventional three-dimensional renderings suffer for several shortcomings. For example, navigation of conventional three-dimensional renderings can be cumbersome as a user tries to achieve particular views of various features. Additionally, conventional systems may not be able to portray a true scale of a finished product. For example, a user's view of a conventional three-dimensional rendering on a computer screen may fall short on conveying a full appreciation for the scale of a particular feature or design.

Accordingly, there are a number of problems in the art that can be addressed.

BRIEF SUMMARY

Implementations of the present invention comprise systems, methods, and apparatus configured to allow one or more users to navigate and interact with a three-dimensional rendering of an architectural design. In particular, implementations of the present invention comprise mixed-reality components that create a mixed-reality environment that immerses a user. For example, the mixed-reality components may comprise a headset that at least partially covers a user's eyes and tracks the viewing angle of the user's eyes or the position of the user's head, a mobile phone that displays, to a user, mixed-reality elements, or any other device capable of providing a user a view of a real-world environment and accompanying mixed-reality elements. As such, the mixed-reality components can be used to generate a mixed-reality environment that allows a user to interact with an architectural design within a real-world space.

Embodiments disclosed herein include a computer system for creating architectural schematics within a mixed-reality environment generates, within an architectural design application, mixed-reality rendering data that visually describes one or more virtual architectural elements in relation to a real-world environment. The computer system transmits, to a mixed-reality device, the mixed-reality rendering data, wherein the mixed-reality device renders the mixed-reality rendering data within the real-world environment. The computer system also receives a command from a user directed towards a particular virtual architectural element. Additionally, the computer system constrains a scope of the command based upon an interaction between the virtual architectural element and the real-world environment.

Disclosed embodiments also include a method for creating architectural schematics within a mixed-reality environment. The method includes generating, within an architectural design application, mixed-reality rendering data that visually describes one or more virtual architectural elements in relation to a real-world environment. Additionally, the method includes transmitting, to a mixed-reality device, the mixed-reality rendering data, wherein the mixed-reality device renders the mixed-reality rendering data within the real-world environment. The method also includes receiving a command from a user to create a particular virtual architectural element. In addition, the method includes identifying an environment-defined attribute of the particular virtual architectural element. The method further includes retrieving a physical environment attribute that corresponds with the environment-defined attribute of the particular virtual architectural element. Further still, the method includes constraining a scope of the command based upon the physical environment attribute.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Disclosed embodiments extend to systems, methods, and apparatus configured to allow one or more users to navigate and interact with a three-dimensional rendering of an architectural design. In particular, implementations of the present invention comprise mixed-reality components that create a mixed-reality environment that immerses a user. For example, the mixed-reality components may comprise a headset that at least partially covers a user's eyes and tracks the viewing angle of the user's eyes or the position of the user's head, a mobile phone that displays, to a user, mixed-reality elements, or any other device capable of providing a user a view of a real-world environment and accompanying mixed-reality elements. As such, the mixed-reality components can be used to generate a mixed-reality environment that allows a user to interact with an architectural design within a real-world space.

Disclosed embodiments include a mixed-reality architectural design system that injects mixed-reality elements into a real-world environment. For example, a user may be interested in building out office space on an empty floor of a high-rise building. In various disclosed embodiments, the mixed-reality architectural design system injects mixed-reality elements into the floor space through the user's viewing device. The viewing device may comprise a mixed-reality headset, a virtual reality headset, a mobile phone display, or any other device capable of capturing the real-world space and rendering three-dimensional objects.

Disclosed embodiments allow a user to view virtual renderings of architectural designs within the real world. For instance, the mix-reality architectural design system is capable of displaying to the user mixed-reality elements that include walls, furniture, lights, textures, and various other design elements that have been designed for the user's office. Additionally, the mix-reality architectural design system is capable of receiving commands and presenting options to the user that manipulate and change the architectural design within the mixed-reality world. For example, while wearing a mixed-reality headset, the user may determine that a particular wall needs to be extended. Using appropriate input, which may include hand motions, eye motions, head tracking, input through a keyboard, input through a touch interface, or other similar input, the user directs the mixed-reality architectural design system to extend the wall. In at least one embodiment, the mixed-reality architectural design system extends the wall in real-time such that the user sees the wall being extended within the mixed-reality environment.

Figure 1:
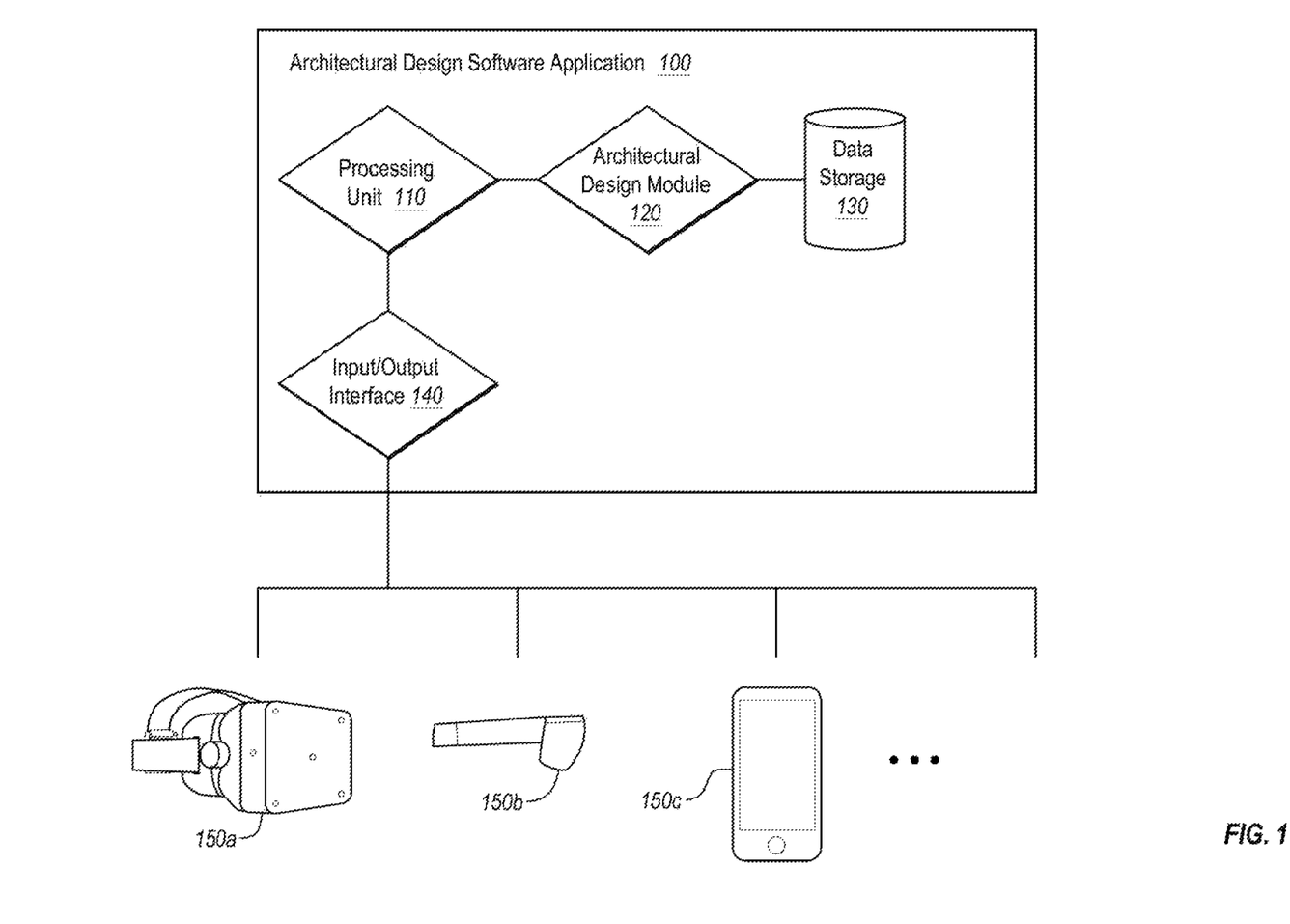
FIG. 1 illustrates a schematic diagram of an embodiment of an architectural design software application.

Turning now to the figures, FIG. 1 illustrates a schematic diagram of an embodiment of an architectural design software application 100 (also referred to herein as a mixed-reality architectural design system). The depicted architectural design software application 100 comprises various modules and components including a processing unit 110, an architectural design module 120, a data storage 130, and an input/output interface 140. One will understand, however, that the depicted modules and components are merely exemplary and are provided for the sake of explanation. In various additional or alternative embodiments, an architectural design software application 100 may comprise different configurations and descriptions of modules and components that are equivalent to those described herein.

As depicted, the architectural design software application 100 is in communication with various mixed-reality devices, including, a virtual-reality device 150a, an augmented-reality device 150b, and a smart phone 150c. As used herein, mixed-reality comprises any usage of computer generated elements that incorporate a virtual object within a user's real-world space. For example, mixed reality includes virtual reality where a user is completely immersed within a virtual world, augmented reality where a user is immersed within both a real-world space and a virtual space, and any other combination thereof of real-world and virtual elements.

The architectural design software application 100 allows a user to incorporate virtual elements within a real-world environment. For example, the user can design an architectural model or schematic using conventional CAD systems. The user can then further design or view the architectural model when interfacing with the architectural design software application 100 through a mixed-reality environment. For example, the user can create an architectural design within a two-dimensional CAD interface. The two-dimensional design can be transformed into a three-dimensional model that can be incorporated into a mixed-reality environment. Similarly, the user may be able to view the two-dimensional design within the mixed-reality environment. Additionally, a user can also create a two- or three-dimensional architectural design within the mixed-reality environment by placing virtual architectural elements within the mixed-reality environment in real-time. For example, the user can cause a wall to be generated within the mixed-reality environment. An associated CAD file can then be updated to reflect the new wall. Accordingly, an entire architectural design can be created entirely within a mixed-reality environment.

In at least one embodiment, a processing unit 110 manages communication and interfacing between an input/output interface 140 and architectural design module 120. The architectural design module 120 may comprise a special-purpose CAD program or a conventional CAD program that is capable of exporting architectural design schematics. In various embodiments, the architectural design module 120 accesses architectural designs files that are stored within a design storage 130. As such, the architectural design module 120 can load a conventional architectural design file that is within data storage 130 and provide the file to processing unit 110.

The processing unit 110 then loads the three-dimensional architectural model into memory. The processing unit 110 generates a coordinate system that associates a virtual coordinate system within the architectural design schematic with a physical coordinate system with a real-world environment. For example, the processing unit 110 may generate a coordinate system that associates the architectural schematic for a user's planned office space with a physical coordinates system that is associated with the physical office space itself. As such, when rendering the mixed-reality elements that are associated with the architectural design schematic, the elements appear within the correct position within the real-world environment due to the common coordinate system generated by the processing unit 110.

The processing unit 110 then transmits to the input/out interface (and on to the mixed-reality devices 150(a-c)) mixed-reality rendering information. The mixed-reality rendering information comprises the three-dimensional model data describing at least a portion of the three-dimensional architectural model and coordinate information that maps the virtual coordinate system to the physical coordinate system. In at least one embodiment, the mixed-reality rendering data consists of only geometry information and texture information describing objects within the three-dimensional architectural model, along with coordinates for properly positioning the objects. As such, in at least one embodiment, the mixed-reality devices 150(a-c) are only rendering received geometries and textures without any metadata or knowledge about attributes associated with the architectural elements. In contrast to providing the entire data available within the CAD file, providing only geometries and textures provides several significant technical benefits, such as requiring significantly less processing power at the mixed-reality devices 150(a-c) and requiring less bandwidth to communicate the information.

The processing unit 110 associates the virtual coordinate system with a physical coordinate system within the particular real-world environment (e.g., an office floor). The processing unit 110 then transmits, to a mixed-reality device 150(a-c), at least a portion of the mixed-reality rendering data. The mixed-reality device 150(a-c) renders at least a portion of the mixed-reality rendering data within the mixed-reality world.

Additionally, in at least one embodiment, the processing unit 110 receives a command from a user to manipulate a virtual architectural element within the mixed-reality environment. For example, the user may be viewing a virtual wall or a virtual piece of furniture. The user may execute a command to change the position of the color of the virtual wall or the virtual piece of furniture. Instead of completely executing the command, however, the processing unit 110 constrains the scope of the command based upon an interaction between the virtual architectural element and the real-world environment. For example, the user may request that the virtual wall be moved to a position that conflicts with the position of a physical wall. The architectural design software application 100 may be aware of the location of the physical wall due to the physical wall's presence within the three-dimensional model data. Alternatively or additionally, the architectural design software application 100 may be aware of the location of the physical wall based upon sensor data received from the mixed-reality device 150(a-c). In any case, the processing unit 110 can identify the interaction and automatically constrains the user's command in accordance to the information.

Figure 2:
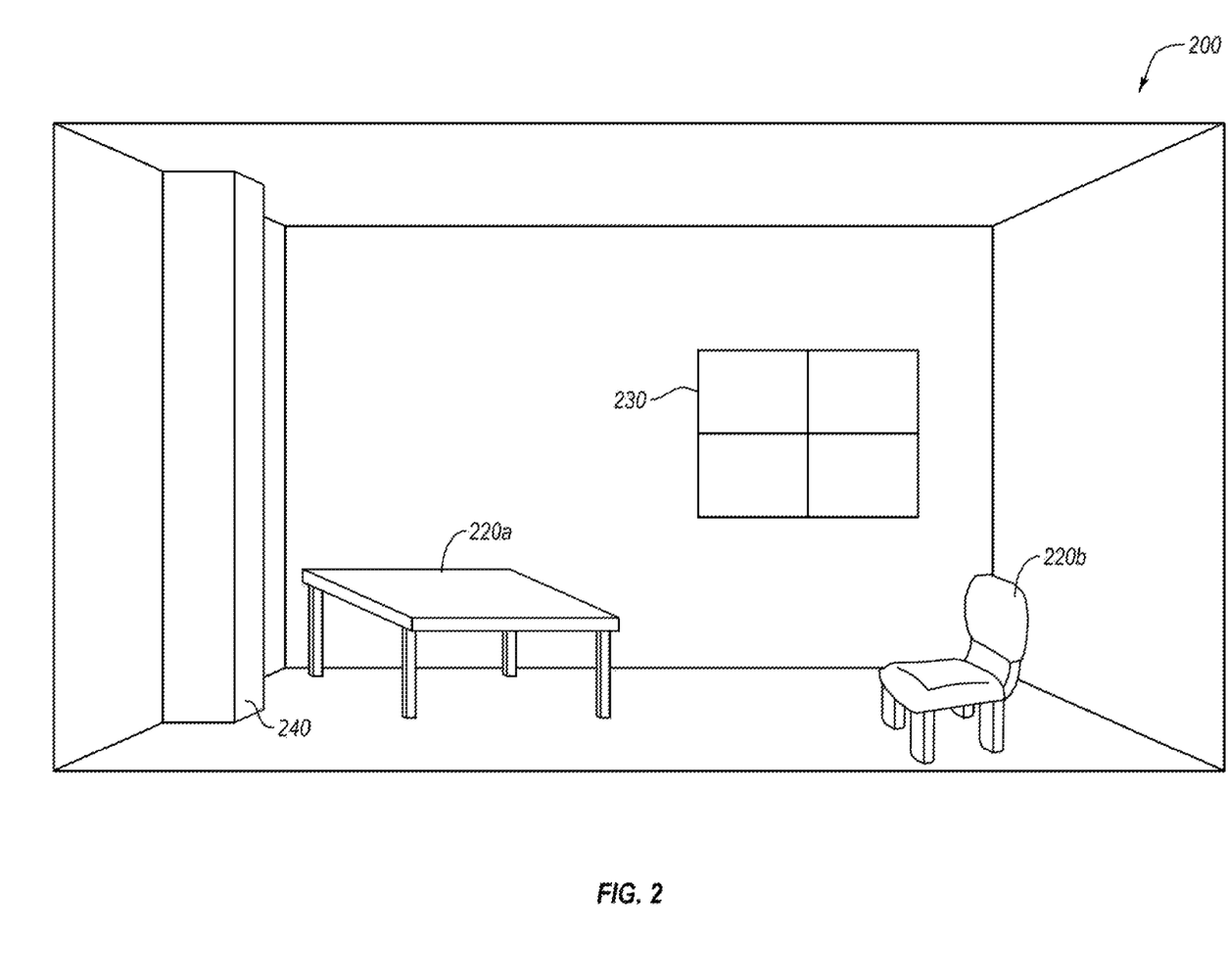
FIG. 2 illustrates a user's view of a room within a real-world environment.

For example, FIG. 2 illustrates a user's view of a room within a real-world environment. The real-world room 200 comprises various physical architectural elements such various pieces of real-world furniture pieces 220(a-c) and a large physical column 240 at one side of the room. The user is able walk around and interact with the room. In the case of augmented reality, the virtual components are directly overlaid with the real-world components, such that the user is given the impression that both the virtual and real-world components are present within the space. The user views both virtual and real-world components through the viewing medium.

Figure 3:
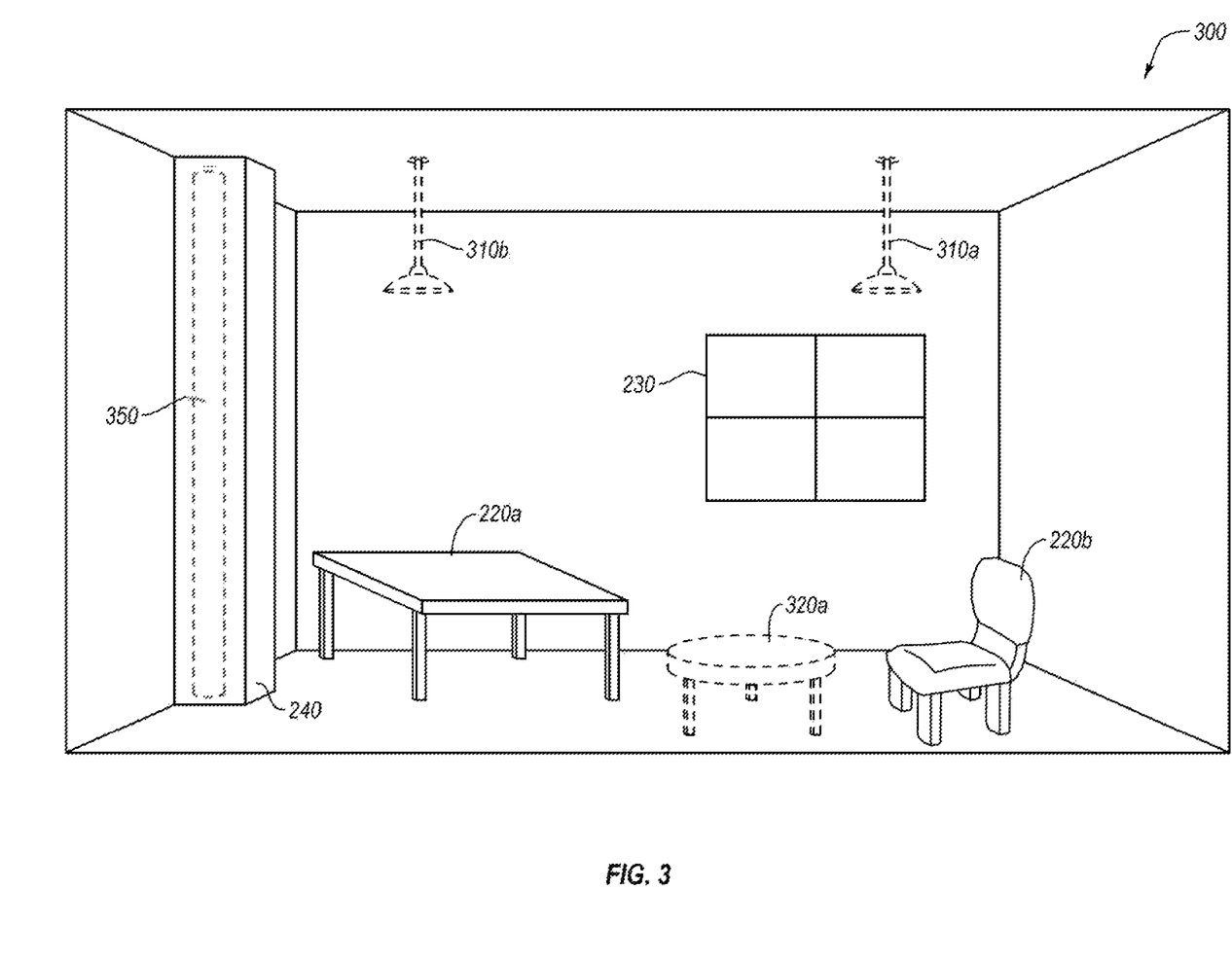
FIG. 3 illustrates a three-dimensional architectural model of the room.

For example, FIG. 3 illustrates a three-dimensional architectural model 300 of the room 200. The three-dimensional architectural model 300 comprises various virtual architectural elements such as light fixtures 310(a, b), various pieces of virtual furniture pieces 320a, and a large conduit 350 running down the inside of the large physical column 240. In at least one embodiment, the three-dimensional model is aware of or includes the physical architectural elements 220a, 220b, 230, 240 of the room 200; however, these elements are not rendered within a mixed-reality scenario. In at least one embodiment, certain aspects of a room may be intentionally left out of the three-dimensional architectural model 300. For example, a chair that is highly moveable may not be represented because the chair may be moved to any number of different locations within the room 200.

In at least one embodiment, the large conduit 350 represents a corresponding real-world conduit (not visible) that runs through the real-world column 240. As such, in at least one embodiment, the mixed-reality environment is able to depict physical architectural elements to a user that are otherwise obscured. As used herein, these particular architectural elements will be referred to as virtual architectural elements when referring to the actual rendered image and physical architectural elements when referring to the physical, real-world element. One of skill in the art will recognize that a three-dimensional architectural model 300 may comprise far more information than a single large conduit 350 within a column. For example, a three-dimensional architectural model 300 may comprise electrical information, plumbing information, heating and air information, gas information, structural support information, and many other building design components that are not visible to a user within a real-world room.

Figure 4:
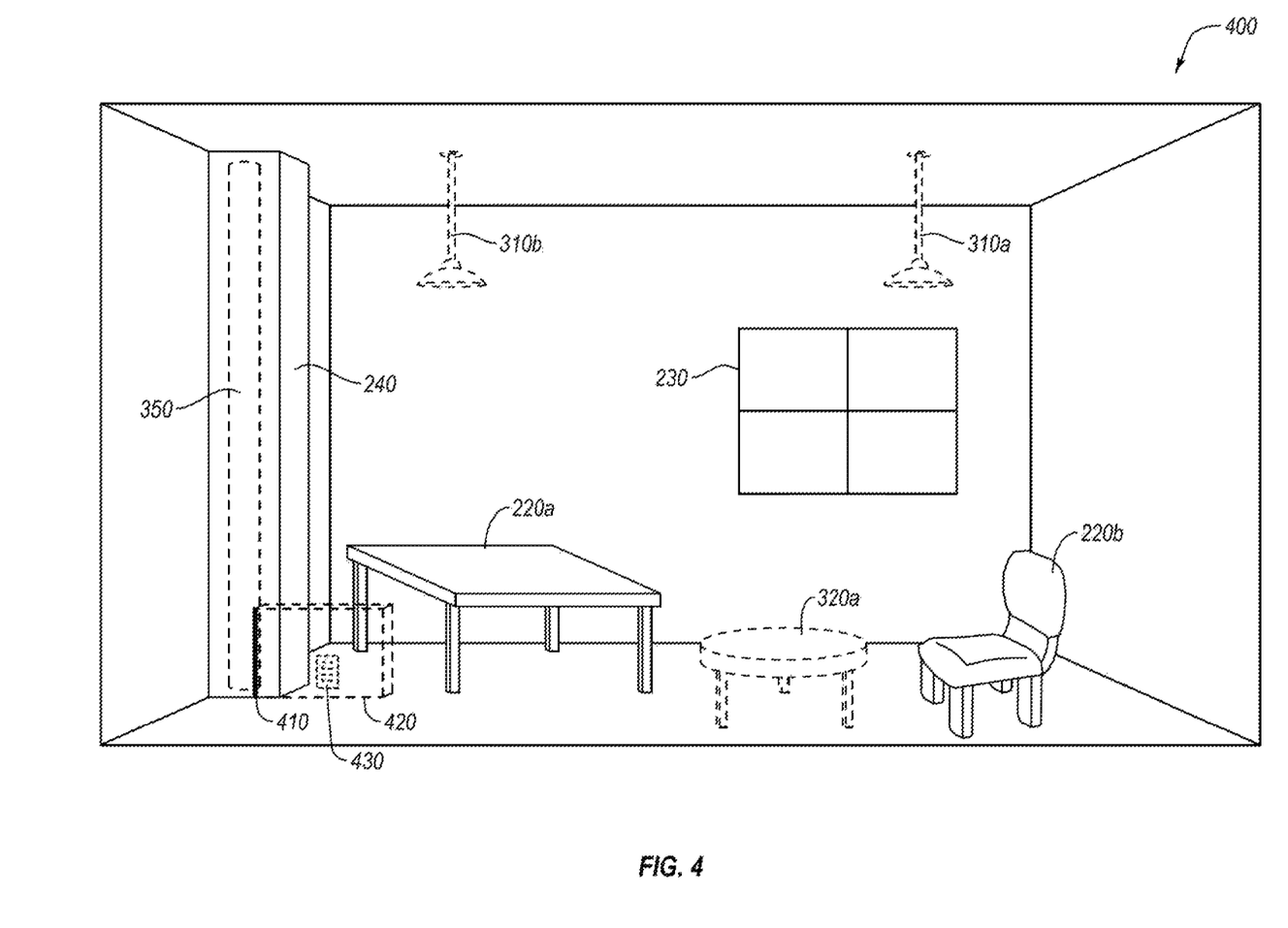
FIG. 4 illustrates a user's view of the room within a three-dimensional mixed-reality environment.

FIG. 4 illustrates a user's view of the room 200 within a three-dimensional mixed-reality environment 400. In particular, the processing unit 110 generated, within the architectural design software application 100, mixed-reality rendering data that visually describes one or more virtual architectural elements in relation to a real-world environment. The architectural design software application 100 then transmitted, to a mixed-reality device, the mixed-reality rendering data. The mixed-reality device renders the mixed-reality rendering data within the real-world environment.

As depicted in FIG. 4, the architectural design software application 100 receives from a user a command directed towards a particular virtual architectural element. In this example, the command requests that a virtual wall 420 be placed within the mixed-reality environment. As depicted, the user intended the wall to extend completely through the physical column 240; however, the processing unit 110 identified a conflict. In particular, the processing unit 110 identified that the new virtual half-wall 420 would extend into the conduit 350. Accordingly, the processing unit 110 constrained a scope of the command based upon an interaction between the virtual architectural element and the real-world environment and only extended the virtual half-wall 420 to the conduit 350 and then the processing unit 110 caused a visual indication of a collision 410 to appear.

Additionally, in at least one additional or alternative embodiment, certain components within the three-dimensional architectural model 300 can be designated as immovable, or locked. For example, in at least one embodiment, the conduit 350 is moveable and the architectural design module 120 automatically reroutes the conduit 350 in response to the user's new half-wall 420. As such, a designer can designate specific portions of a three-dimensional model as being locked and unchangeable. In at least one embodiment, an entire class of elements, such as all plumbing or all electrical, can be locked.

In at least one embodiment, when viewing the three-dimensional mixed-reality environment 400, the large physical column 240 can be painted or rendered-over such that it is apparent to the user that the column has been removed. As such, a user can remove real-world objects from a mixed-reality environment and the architectural design software application 100 can render over the real-world objects to make them appear removed from the scene or otherwise indicate that they have been removed from the architectural model. Similarly, the architectural design software application 100 can make real-world objects appear transparent, such that the interior of the object is exposed. For example, the architectural design software application 100 may allow a user to see pipes or wires behind a wall.

Additionally, as described above, the architectural design software application 100 can cause the mixed-reality devices 150(*a-c*) to render a visual indication of a collision 410 within the mixed-reality environment 400. In at least one implementation, the collision is identified by comparing the virtual architectural element to data related to the real-world environment. The visual indication of a collision 410 may comprise rendering the point of collision in a particular color, such as bright red. As such, in at least one embodiment, a user can easily identify areas where a design decision needs to be changed.

Similarly, in at least one embodiment, the architectural design software application 100 causes the mixed-reality devices 150(*a-c*) to render an entire three-dimensional architectural model 300 within the mixed-reality environment 400. The three-dimensional architectural model 300 may be rendered to be semi-transparent, so that the user can see the real-world room through the rendering. As such, the user can visually identify errors in the three-dimensional architectural model 300 by simply seeing where the model fails to align with the actual physical structure of the room.

In addition to identifying points of collision and depicting non-visible elements to a user, in at least one embodiment, the architectural design software application 100 also interprets user commands with reference to the real-world environment. For example, when receiving a command to build a wall, the processing unit 110 accesses a three-dimensional architectural model 300 of the real-world environment and identifies the height of the room along with the location of joists in the floor and ceiling. Using this information, the processing unit 110 constrains a user's command regarding placement of the wall by adjusting the location of the new wall to best align with joints and designs the wall to extend the proper height.

Similarly, using information within the three-dimensional architectural model 300, the processing unit 110 automatically incorporates proper connecting elements into the new wall. For example, the processing unit 110 determines the type and length of wallboard, the type and length of studs, the type and number of screws, and the type and number plates to connect the wall to the joists. The processing unit 110 automatically incorporates the connection elements into the mixed-reality environment, and in turn, into the three-dimensional architectural model 300.

As stated above, in at least one embodiment, the architectural design software application 100 can constrain the scope of a user's command based upon an interaction between the virtual architectural element and the real-world environment. For example, in FIG. 4, the user can generate a command to enlarge the virtual wall 420 to a predetermined larger dimension. Upon receiving the command, the processing unit 110 identifies physical dimensions of a portion of the real-world environment (i.e., the room in FIG. 4) where the virtual wall is rendered.

In this example, the processing unit 110 determines that the command to enlarge the dimensions of the virtual architectural element would cause the virtual architectural element (i.e., the virtual wall 420) to encroach upon a physical architectural element within the real-world environment. For instance, the processing unit 110 determined that if the user's specified dimensions where used to create the virtual wall 420, the virtual wall 420 would encroach upon the physical column 240. Upon identifying the encroachment, the processing unit 110 constrains the scope of the command by reducing the predetermined larger dimension such that the wall does not encroach upon the physical architectural element within the real-world environment.

In at least one alternative or additional embodiment, the processing unit 110 is able to determine the interaction between a virtual architectural element and the real-world environment based upon information stored within the three-dimensional architectural model. For example, the three-dimensional architectural model comprises both information about the virtual architecture elements and information about the real-world environment, including physical architectural element. Returning to the above example, the processing unit 110 may identify the physical dimensions of the real-world environment accessing dimensional information from a three-dimensional schematic of the portion of the real-world environment.

In contrast, in at least one embodiment, the processing unit 110 determines interactions between the virtual architectural element and the real-world environment based upon data received from sensors within the mixed-reality devices 150(*a-c*). For example, the processing unit 110 can identifying physical dimensions of the portion of the real-world environment by receiving dimensional information from one or more depth sensors associated with the mixed-reality devices 150(*a-c*). As such, in at least one embodiment, the processing unit 110 is constraining a user command based upon data received in real-time that describes attributes of the real-world environment.

As another example, in at least one embodiment, the processing unit 110 receives a command from a user to create a particular virtual architectural element. For example, the user may generate a command to place virtual electrical outlet 430 at a particular location within the virtual wall 420. Upon receiving the command, the processing unit 110 identifies an environment-defined attribute of the particular virtual architectural element. As used herein, an environment-defined attribute comprises an attribute of a virtual architectural element that requires interaction with a physical architectural element in order to function. For instance, the virtual electrical outlet 430 would need to connect to physical electrical wiring in order to be functional.

Once the processing unit 110 identifies the environment-defined attribute that is associated within the virtual architectural element, the processing unit 110 retrieves a physical environment attribute that corresponds with the environment-defined attribute of the particular virtual architectural element. For example, the processing unit 110 retrieves information regarding electrical wiring within the real-world environment. In the depicted example, the physical electrical wiring is encased within the conduit 350. The processing unit 110 then constrains the scope of the command based upon the physical environment attribute. For example, the processing unit may constrain the placement of the virtual electrical outlet based upon where it is reachable by wiring within the conduit 350.

In at least one embodiment, once the virtual electrical outlet 430 is rendered within the virtual wall 420, the processing unit 110 may also render at least a portion of the conduit 350 such that virtual electrical wiring is shown connecting to the virtual electrical outlet 430. As such, in at least one embodiment, a portion of a physical architectural element may be rendered in such a way that it no longer represents the actual physical form of the element. Instead, the rendering represents an adjusted form of the physical architectural element that would be present if the corresponding virtual architectural element were ever constructed.

In an additional or alternative embodiment, a user may be creating the virtual wall 420 within a mixed-reality environment. In such a case, the environment-defined attribute of the particular virtual architectural element may comprise a color of the virtual wall. In order to apply a correct virtual color to the virtual wall, the processing unit 110 may receive an image of the real-world environment from the mixed-reality device 150(a-c). The processing unit 110 may then identify a physical color of a wall adjacent to the virtual wall. For example, the processing unit 110 may identify the color of the column 240. The processing unit 110 then constrains the scope of the command by applying a virtual paint color that matches the physical color to the virtual wall.

Figure 5:
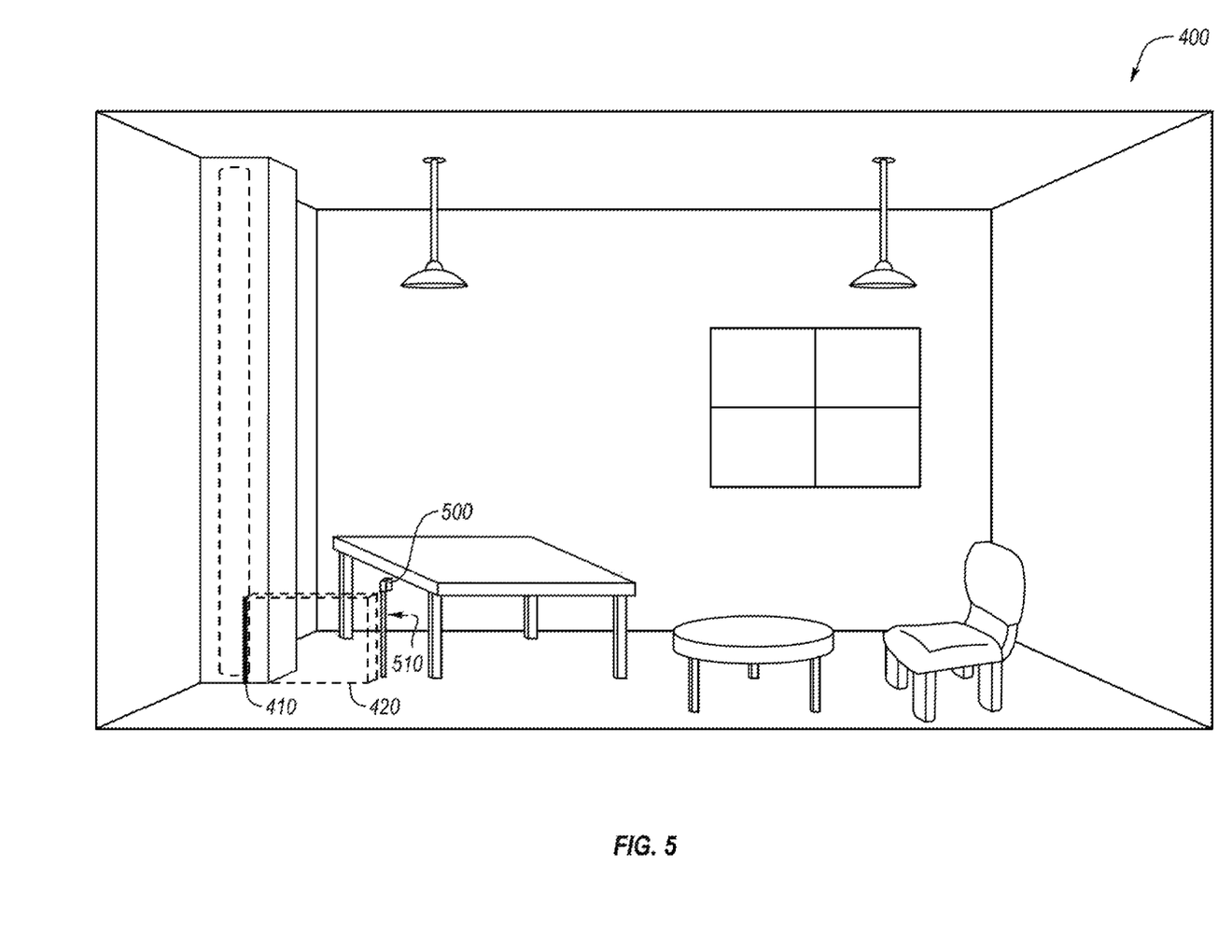
FIG. 5 illustrates another view of the room within a three-dimensional mixed-reality environment.

Turning now to FIG. 5, FIG. 5 illustrates another view of the room within a three-dimensional mixed-reality environment 400. In at least one embodiment, a user can incorporate real-world tools into a mixed-reality environment 400. For example, a user can measure a virtual architectural element, such as the virtual wall 420, using a physical measuring tape 500. Additionally, in at least one embodiment, the architectural design software application 100 incorporates and reacts to the use of physical tools.

For example, the virtual wall 420 may be configured within the mixed-reality environment 400 to have a height of forty-eight inches. When a user measures the virtual wall 420 with a physical measuring tape 500, the architectural design software application 100 may receive through a camera associated with the user's mixed-reality device 150 (a-c) an image of the physical measuring tape 500 with respect to the virtual wall 420. The architectural design software application 100 then utilizes an optical character recognition algorithm to read the height of the virtual wall 420 from the physical measuring tape 500. If the architectural design software application 100 determines that the virtual wall 420 is incorrectly rendered such that the height is not correct, the architectural design software application 100 adjusts the height of the virtual wall 420 such that it measures forty-eight inches. Additionally, the architectural design software application 100 may adjust other aspects of the mixed-reality environment to compensate for the difference in height.

In at least one embodiment, a user can generate a command to adjust an attribute of the virtual architectural element based upon a physical tool within the real-world environment. For example, the user can generate a command to increase the height of the virtual wall 420 to 50 inches based upon the reading of the physical measuring tape 500. Upon receiving the command, the processing unit can constrain the scope of the command such that the resulting virtual wall 420 matches the 50-inch reading on the physical measuring tape 500.

While the above example describes the use of a physical measuring tape to measure and adjust attributes of a mixed-reality environment, one will understand that the scope of the disclosed embodiments is not so limited. For example, in various additional or alternative embodiments, a user may utilize a physical leveler within the mixed reality environment. Similarly, the architectural design software application 100 can automatically adjust the mixed-reality environment based upon deviations from the leveler. Similar functionality can be provided by a wide array of physical tools within a mixed-reality environment. As such, disclosed embodiments include the use of physical tools within a mixed-reality environment and the automatic adjustment of the mixed-reality environment based upon the use of the tools.

Accordingly, in at least one embodiment, the combination of both a CAD that describes at least a portion of a room, or some other architectural structure, and a mixed-reality environment allows the architectural design software application 100 to automatically account for various design aspects that are not otherwise visible to a user. Additionally, the architectural design software application 100 is able to create a resulting CAD file that includes the user's changes within the mixed-reality environment and various parts lists accounting for the user's changes.

Accordingly, FIGS. 1-5 and the corresponding text illustrate or otherwise describe one or more components, modules, and/or mechanisms for creating architectural schematics within a mixed-reality environment. The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 6:
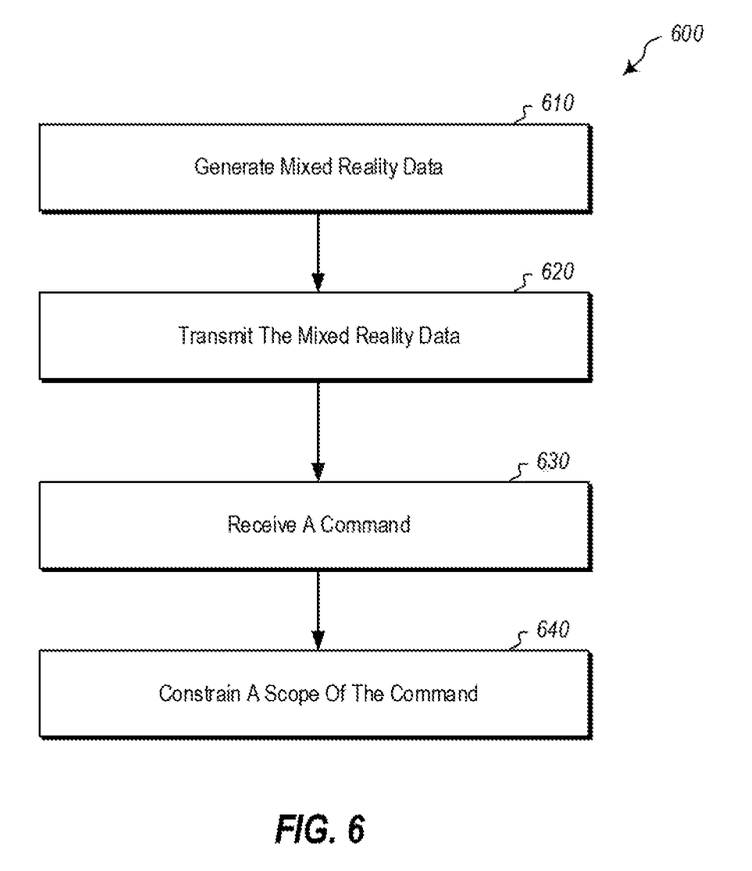
FIG. 6 illustrates a flowchart of steps in a method for creating architectural schematics within a mixed-reality environment.

For example, FIG. 6 illustrates that a method 600 for creating architectural schematics within a mixed-reality environment includes an act 610 of generating mixed-reality data. Act 610 comprises generating, within an architectural design software application 100, mixed-reality rendering data that visually describes one or more virtual architectural elements in relation to a real-world environment. For example, as depicted and described with respect to FIGS. 1 and 2, the architectural design software application 100 comprises a processing unit 110 that loads a three-dimensional architectural model from data storage. The processing unit 110 generates mixed-reality data from the three-dimensional architectural model.

Additionally, method 600 includes an act 620 of transmitting the mixed-reality data. Act 620 comprises transmitting, to a mixed-reality device, the mixed-reality rendering data, wherein the mixed-reality device renders the mixed-reality rendering data within the real-world environment.

For example, as depicted and described with respect to FIGS. 1 and 2, the input/output interface 140 communicates the mixed-reality rendering data to a mixed-reality device 150(*a-c*). The mixed-reality device 150(*a-c*) renders the mixed-reality rendering data such that one or more virtual architectural elements are rendered within a mixed-reality environment.

Method 600 also includes an act 630 of receiving a command. Act 630 comprises receiving a command from a user directed towards a particular virtual architectural element. For example, as depicted and described with respect to FIGS. 4 and 5, a user can generate a command to create a virtual wall 420 within the mixed-reality environment 400.

Method 600 also includes an act 640 of constraining a scope of the command. Act 640 comprises constraining a scope of the command based upon an interaction between the virtual architectural element and the real-world environment. For example, as depicted and described with respect to FIGS. 4 and 5, the processing unit 110 can constrain the command such that the dimensions of the create virtual wall are adjusted to fit within the space allowed in the real-world. For instance, the dimensions of the virtual wall can be constrained such that the wall does not encroach upon the column 240.

Figure 7:
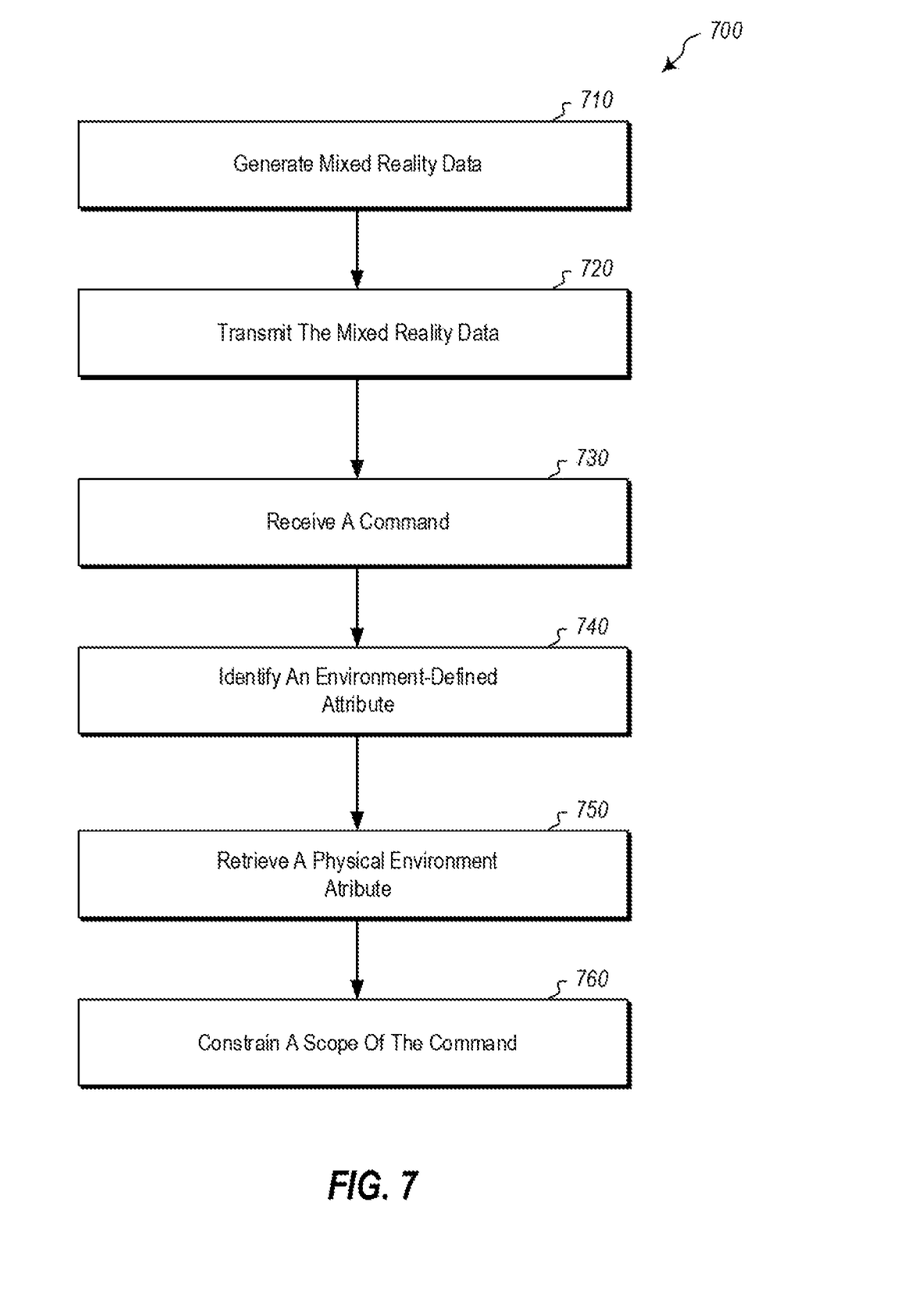
FIG. 7 illustrates a flowchart of steps in another method for creating architectural schematics within a mixed-reality environment.

FIG. 7 illustrates an additional or alternative method 700 for creating architectural schematics within a mixed-reality environment includes an act 710 of generating mixed-reality data. Act 710 comprises generating, within an architectural design software application 100, mixed-reality rendering data that visually describes one or more virtual architectural elements in relation to a real-world environment. For example, as depicted and described with respect to FIGS. 1 and 2, the architectural design software application 100 comprises a processing unit 110 that loads a three-dimensional architectural model from data storage. The processing unit 110 generates mixed-reality data from the three-dimensional architectural model.

Additionally, method 700 includes an act 720 of transmitting the mixed-reality data. Act 720 comprises transmitting, to a mixed-reality device, the mixed-reality rendering data, wherein the mixed-reality device renders the mixed-reality rendering data within the real-world environment. For example, as depicted and described with respect to FIGS. 1 and 2, the input/output interface 140 communicates the mixed-reality rendering data to a mixed-reality device 150(*a-c*). The mixed-reality device 150(*a-c*) renders the mixed-reality rendering data such that one or more virtual architectural elements are rendered within a mixed-reality environment.

Method 700 also includes an act 730 of receiving a command. Act 730 comprises receiving a command from a user directed towards a particular virtual architectural element. For example, as depicted and described with respect to FIGS. 4 and 5, a user can generate a command to create a virtual wall 420 within the mixed-reality environment 400.

In addition, method 700 includes an act 740 of identifying an environment-defined attribute. Act 740 comprises identifying an environment-defined attribute of the particular virtual architectural element. For example, as depicted and described with respect to FIG. 4, the processing unit 110 identifies that the electrical outlet 430 is associated with an environment-defined attribute of wiring. In at least one embodiment the environment-defined attributes of each type of virtual architectural element are stored within the data store 130.

Further, method 700 includes an act 750 of retrieving a physical environment attribute. Act 750 comprises retrieving a physical environment attribute that corresponds with the environment-defined attribute of the particular virtual architectural element. For example, as depicted and described with respect to FIG. 4, the processing unit 110 can determine that the conduit 350 contains electrical wiring.

Further still, method 700 includes an act 760 of constraining a scope of the command 760. Act 760 comprises constraining a scope of the command based upon the physical environment attribute. For example, as depicted and described with respect to FIG. 4, the processing unit 110 can constrain a command regarding the placement of the electrical outlet 430 such that the electrical outlet 430 is placed in a location that can receive power from the conduit 350.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry or desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computer system for creating architectural schematics within a mixed-reality environment, comprising:
    one or more processors; and
    one or more computer-readable media having stored thereon executable instructions that when executed by the one or more processors configure the computer system to perform at least the following:
        generate, within an architectural design application, mixed-reality rendering data that visually describes one or more virtual architectural elements in relation to a real-world environment;
        transmit, to a mixed-reality display device, the mixed-reality rendering data, wherein the mixed-reality display device renders the mixed-reality rendering data within the real-world environment;
        receive, from a camera associated with the mixed-reality display device, an image of a physical measuring tape measuring a virtual architectural element;
        identify a physically measured attribute of the virtual architectural element by processing the image of the physical measuring tape with an optical character recognition algorithm to read the physically measured attribute from the physical measuring tape with respect to the virtual architectural element;
        determine, based at least in part on the physically measured attribute, that a height, width, or depth of the virtual architectural element or a position of the virtual architectural element in relation to the real-world environment is different from a value defined by the architectural design application; and
        adjust the height, width, or depth of the virtual architectural element or the position of the virtual architectural element in relation to the real-world environment to match the value defined by the architectural design application based at least in part on the physically measured attribute.

2. The computer system as recited in claim 1, wherein the executable instructions include instructions that are executable to configure the computer system to adjust other aspects of the mixed-reality environment based upon the adjusted the height, width, or depth of the virtual architectural element.

3. The computer system as recited in claim 1, wherein the executable instructions include instructions that are executable to configure the computer system to receive a command from a user to adjust the height, width, or depth of the virtual architectural element to a particular measurement based upon the physical measuring tape.

4. The computer system as recited in claim 3, wherein the executable instructions include instructions that are executable to configure the computer system to:
    adjust a height, width, or depth of the virtual architectural element to the particular measurement as indicated by the physical measuring tape.

5. The computer system as recited in claim 1, wherein the executable instructions include instructions that are executable to configure the computer system to:
    receive a command from a user to create a particular virtual architectural element, wherein identifying an environment-defined attribute of the particular virtual architectural element comprises identifying wiring requirements associated with an electrical outlet;
    retrieve a physical environment attribute that corresponds with the environment-defined attribute of the particular virtual architectural element; and
    constrain a scope of the command based upon the physical environment attribute.

6. The computer system as recited in claim 5, wherein the physical environment attribute comprises a location of physical electrical wiring within the real-world environment that is configurable for connecting to the electrical outlet.

7. The computer system as recited in claim 6, wherein the physical environment attribute further comprises an indication that the physical electrical wiring is moveable.

8. The computer system as recited in claim 7, wherein the executable instructions include instructions that are executable to configure the computer system to:
    generate a rendering of the physical electrical wiring that depicts a pathway of at least a portion of the physical electrical wiring as extending towards a location of the electrical outlet, wherein the rendering of the physical electrical wiring does not correspond with a location of the physical electrical wiring; and constrain the scope of the command based upon the physical environment attribute, by placing the electrical outlet in a location that intersects with the rendering of the physical electrical wiring.

9. A method for creating architectural schematics within a mixed-reality environment, comprising:

generating, within an architectural design application, mixed-reality rendering data that visually describes one or more virtual architectural elements in relation to a real-world environment;

transmitting, to a mixed-reality display device, the mixed-reality rendering data, wherein the mixed-reality display device renders the mixed-reality rendering data within the real-world environment;

receiving, from a camera associated with the mixed-reality display device, an image of a physical measuring tape measuring a virtual architectural element;

identifying a physically measured attribute of the virtual architectural element by processing the image of the physical measuring tape with an optical character recognition algorithm to read the physically measured attribute from the physical measuring tape with respect to the virtual architectural element;

based upon the physically measured attribute, determining, based at least in part on the physically measured attribute, that a height, width, or depth of the virtual architectural element or a position of the virtual architectural element in relation to the real-world environment is different from a value defined by the architectural design application is different from a value defined by the architectural design application; and adjusting the height, width, or depth of the virtual architectural element or the position of the virtual architectural element in relation to the real-world environment to match the value defined by the architectural design application based at least in part on the physically measured attribute.

10. The method as recited in claim 9, further comprising adjusting other aspects of the mixed-reality environment based upon the adjusted the height, width, or depth of the virtual architectural element.

11. The method as recited in claim 9, further comprising receiving a command from a user to adjust the height, width, or depth of the virtual architectural element to a particular measurement based upon the physical measuring tape.

12. The method as recited in claim 11, further comprising adjusting a height, width, or depth of the virtual architectural element to the particular measurement as indicated by the physical measuring tape.

13. The method as recited in claim 9, further comprising:

receiving a command from a user to create a particular virtual architectural element, wherein identifying an environment-defined attribute of the particular virtual architectural element comprises identifying wiring requirements associated with an electrical outlet;

retrieving a physical environment attribute that corresponds with the environment-defined attribute of the particular virtual architectural element; and constraining a scope of the command based upon the physical environment attribute.

14. The method as recited in claim 13, wherein the physical environment attribute comprises a location of physical electrical wiring within the real-world environment that is configurable for connecting to the electrical outlet.

15. The method as recited in claim 14, wherein the physical environment attribute further comprises an indication that the physical electrical wiring is moveable.

16. The method as recited in claim 15, further comprising:

generating a rendering of the physical electrical wiring that depicts a pathway of at least a portion of the physical electrical wiring as extending towards a location of the electrical outlet, wherein the rendering of the physical electrical wiring does not correspond with a location of the physical electrical wiring; and constraining the scope of the command based upon the physical environment attribute, by placing the electrical outlet in a location that intersects with the rendering of the physical electrical wiring.

17. A computer program product comprising one or more non-transitory computer storage media having stored thereon computer-executable instructions that, when executed at a processor, cause a computer system to perform a method for creating architectural schematics within a mixed-reality environment, the computer-executable instructions configuring the processor to:

generate, within an architectural design application, mixed-reality rendering data that visually describes one or more virtual architectural elements in relation to a real-world environment;

transmit, to a mixed-reality display device, the mixed-reality rendering data, wherein the mixed-reality display device renders the mixed-reality rendering data within the real-world environment;

receive, from a camera associated with the mixed-reality display device, an image of a physical measuring tape measuring a virtual architectural element;

identify a physically measured attribute of the virtual architectural element by processing the image of the physical measuring tape with an optical character recognition algorithm to read the physically measured attribute from the physical measuring tape with respect to the virtual architectural element;

determine, based at least in part on the physically measured attribute, that a height, width, or depth of the virtual architectural element or a position of the virtual architectural element in relation to the real-world environment is different from a value defined by the architectural design application is different from a value defined by the architectural design application; and adjust the height, width, or depth of the virtual architectural element or the position of the virtual architectural element in relation to the real-world environment to match the value defined by the architectural design application based at least in part on the physically measured attribute.

18. The computer program product as recited in claim 17, further comprising computer-executable instructions that configure the processor to receive a command from a user to adjust the height, width, or depth of the virtual architectural element to a particular measurement based upon the physical measuring tape.

19. The computer program product as recited in claim 18, further comprising computer-executable instructions that configure the processor to adjust a height, width, or depth of the virtual architectural element to the particular measurement as indicated by the physical measuring tape.

* * * * *